(12) United States Patent
Schram et al.

(10) Patent No.: US 7,226,827 B2
(45) Date of Patent: Jun. 5, 2007

(54) METHOD FOR FABRICATING SEMICONDUCTOR DEVICES HAVING SILICIDED ELECTRODES

(75) Inventors: Tom Schram, Rixensart (BE); Jacob Christopher Hooker, Leuven (BE); Marcus Johannes Henricus van Dal, Leuven (BE)

(73) Assignees: Interuniversitair Microelektronica Centrum (IMEC), Leuven (BE); Koninklijke Philips Electronics N.V., B.A. Eindhoven (NL)

( * ) Notice: Subject to any disclaimer, the term of this patent is extended or adjusted under 35 U.S.C. 154(b) by 225 days.

(21) Appl. No.: 10/978,786

(22) Filed: Oct. 18, 2004

(65) Prior Publication Data

US 2005/0145943 A1    Jul. 7, 2005

(30) Foreign Application Priority Data

Oct. 17, 2003    (BE)    ............................. 2003/0548

(51) Int. Cl.
H01L 21/8238    (2006.01)
H01L 21/44    (2006.01)

(52) U.S. Cl. ............... 438/199; 438/682; 257/E21.199; 257/E21.636

(58) Field of Classification Search ............... 438/682; 257/E21.199, E21.636
See application file for complete search history.

(56) References Cited

U.S. PATENT DOCUMENTS

| 6,200,834 B1 | 3/2001 | Bronner et al. |
| 6,512,296 B1 | 1/2003 | Gauthier, Jr. et al. |
| 6,902,969 B2 * | 6/2005 | Adetutu et al. ............. 438/199 |
| 2002/0086491 A1 | 7/2002 | Kizilyalli et al. |
| 2002/0102802 A1 * | 8/2002 | Tan et al. ................... 438/305 |
| 2003/0124808 A1 * | 7/2003 | Lu et al. ..................... 438/303 |
| 2003/0143825 A1 | 7/2003 | Matsuo et al. |

FOREIGN PATENT DOCUMENTS

| EP | 0 935 285 A1 | 8/1999 |
| EP | 1 211 729 A2 | 6/2002 |

* cited by examiner

*Primary Examiner*—Lex Malsawma
(74) *Attorney, Agent, or Firm*—Knobbe Martens Olson & Bear LLP

(57) ABSTRACT

The invention relates to a method for fabricating a semiconductor device having a semiconductor body that comprises a first semiconductor structure having a dielectric layer and a first conductor, and a second semiconductor structure having a dielectric layer and a second conductor, that part of the first conductor which adjoins the dielectric layer having a work function different from the work function of the corresponding part of the second conductor. In one embodiment of the invention, after the dielectric layer has been applied to the semiconductor body, a metal layer is applied to the said dielectric layer, and then a silicon layer is deposited on the metal layer and is brought into reaction with the metal layer at the location of the first semiconductor structure, forming a metal silicide. In one embodiment, those parts of the conductors which have different work functions are formed by etching a layer other than the silicon layer, in particular a metal layer, at the location of one of the two semiconductor structures. Furthermore, a further metal layer is applied over the silicon layer and is used to form a further metal silicide at the location of the second transistor. One embodiment of the invention is particularly suitable for use in CMOS technology and results in both PMOS and NMOS transistors with favorable properties.

32 Claims, 7 Drawing Sheets

METHOD FOR FABRICATING SEMICONDUCTOR DEVICES HAVING SILICIDED ELECTRODES

RELATED APPLICATIONS

This application claims the benefit under 35U.S.C. §119 (a)-(d) of Belgium Application No. 20030548filed on Oct. 17, 2003, which is hereby incorporated by reference herein.

BACKGROUND OF THE INVENTION

1. Field of the Invention

The present invention relates to a method for fabricating semiconductor devices having a dielectric layer and at least two silicide electrodes, that part of each of the at least two silicided electrodes which adjoins the dielectric layer having a different work function.

2. Description of the Related Technology

The fabrication of, for example, silicon CMOSFETs (complementary metal oxide semiconductor field-effect transistors) requires PMOS and NMOS structures or transistors on the same substrate. In this context, for both types of transistors to operate optimally, it is important for the work function of at least that part of the gate electrode of the first transistor, for example a PMOST, which adjoins the dielectric layer to differ from that of the second, for example, an NMOST. The latter requires a gate electrode with a low work function, namely a work function which is in the vicinity of that of n-type polycrystalline silicon, i.e., approximately 4.2 eV, whereas the former needs a work function which is in the vicinity of that of p-type polycrystalline silicon, i.e. 5.2 eV.

A method for fabricating structures of this type is known from EP 1211729.That document shows the fabrication of a couple of MOS transistors, wherein a metal layer is to be applied to a dielectric layer located in the regions of both transistors, and then a silicon layer is to be applied to the metal layer. The silicon layer is removed again at the location of one of the two transistors with the aid of photolithography and etching, after which, with the aid of a heat step, the silicon at the location of the other transistor is brought into reaction with the metal beneath it, forming a metal silicide which then adjoins the dielectric layer. The gate electrode of the first transistor formed next to the latter then contains a metal adjoining the dielectric layer. In this way, in EP 1211729, adjacent gate electrodes with different work functions are formed, the specific work functions being that of the silicide and that of the metal, and consequently both NMOS and PMOS transistors can be simultaneously provided with optimum properties.

One drawback of the method discussed above is that the local removal of the silicon results in an undesired asymmetry in the structure of the two transistors, which has various associated drawbacks. The local removal of the silicon produces a difference in the thickness of the gate electrodes having a different work function. This difference in height can give rise to deviations in the width of the gate electrodes during the exposure step in which the pattern of the gate electrodes is formed in a photosensitive layer on top of the gate electrode layer. As a result, the electrical characteristics of the transistors may deviate from the desired value. This difference in thickness also makes it more difficult to form the spacers, since the dimensions of the latter are also determined by the height of the gate electrode against which these spacers bear. During the formation of the source and drain regions by means of an ion implantation step, this difference in thickness presents the risk of ions being implanted or being able to diffuse through the thinner gate electrode into the channel region below. To solve this problem, the implantation parameters have to be additionally optimized.

SUMMARY OF CERTAIN INVENTIVE ASPECTS OF THE INVENTION

One aspect of the present invention provides a method which makes it easy to form two electrodes having a different work function, in particular a method in which both a NMOS transistor and a PMOS transistor can be fabricated simultaneously with gate electrodes whose parts that adjoin the dielectric layer have a different and appropriate work function and which does not have the above-mentioned drawback of asymmetry.

A first embodiment of the invention provides a method for fabricating a semiconductor device having a semiconductor body, the semiconductor body comprising: a first semiconductor structure having a dielectric layer and a first electrode that comprises a first conductor, and a second semiconductor structure having a dielectric layer and a second electrode that comprises a second conductor which differs from the first conductor and of which the part that adjoins the dielectric layer has a different work function from the corresponding part of the first conductor.

In one embodiment of the invention, after the dielectric layer has been applied to the semiconductor body, a first metal layer is applied to the dielectric layer, and then a silicon layer is applied to the first metal layer and these two layers are brought into reaction with one another at the location of at least one semiconductor structure, with a first metal silicide being formed. In one embodiment, the parts of the conductors having different work functions are formed by etching a layer other than the silicon layer at the location of one of the two semiconductor structures.

Another embodiment of the invention describes a method for fabricating a semiconductor device having a substrate and a semiconductor body, wherein the semiconductor body may comprise: a first field-effect transistor comprising a first source and drain region and having a channel region of a first conduction type and comprising a first gate electrode which is separated from the channel region by a dielectric layer and comprises a first conductor, and a second field-effect transistor comprising a second source and drain region and comprising a channel region of a second conduction type, which is the opposite conduction type from the first conduction type, and comprising a second gate electrode, which is separated from the channel region by a dielectric layer and comprises a second conductor which differs from the first conductor and of which the part that adjoins the dielectric layer has a different work function from the corresponding part of the first conductor.

In one embodiment, after the dielectric layer has been applied to the semiconductor body, a first metal layer is applied to the dielectric layer, on top of which a silicon layer is applied, the first metal layer and the silicon layer being brought into reaction with one another at the location of the first transistor, with a first metal silicide being formed at that location. The parts of the conductors having different work functions are formed by etching a layer other than the silicon layer at the location of one of the two transistors.

In a preferred embodiment of the invention, the first metal layer may be a siliciding metal layer. This layer may be formed at the location of both semiconductor structures and may, prior to the deposition of the silicon layer, be removed at the location of, for example, the second transistor, for example, by etching. This first metal layer may be very thin and is preferably between 5 and 50 nm thick and may contain various suitable metals which form a silicide with silicon, for example, nickel, titanium or cobalt, and in a preferred embodiment is nickel.

In another embodiment, a second, non-siliciding metal layer is arranged between the first metal layer and the dielectric layer. In this case, the first metal layer, which is a siliciding metal layer, can be deposited on top of the second metal layer. The non-siliciding metal layer may, for example, be a layer of molybdenum, tungsten, platinum, iridium, tantalum, hafnium or another suitable metal. This non-siliciding metal layer preferably comprises a metal which is stable compared to the metal of the first metal layer and compared to the metal silicide which is to be formed. Metals such as tungsten, molybdenum and tantalum are particularly suitable with regard to the desired stability compared to a metal which forms a metal silicide and the silicide which is thereby formed. In this embodiment of the invention, the second metal layer, i.e., the non-siliciding metal layer, is removed, for example, by etching, at the location of one of the transistors. This removal can be effected prior to the deposition of the silicon layer.

The method may also include the deposition of a third metal layer after the first and second semiconductor structures have been formed, wherein the third metal layer is a siliciding metal layer, which, for example, may comprise nickel, titanium or cobalt, and with which a further metal silicide can be formed at the location of at least one semiconductor structure. The further metal silicide may have a different silicon content from the first metal silicide. In one embodiment of the invention, the first metal silicide may be formed as a disilicide, and the further metal silicide may be formed as a monosilicide.

In a further embodiment of the invention, the etching of a layer other than the silicon layer can be implemented as the removal of a part of the first, second or third metal layer. The first or second metal layer can be etched prior to the application of the silicon layer.

In one embodiment, the first semiconductor structure and the second semiconductor structure may be a field-effect transistor having a source and drain region and a gate electrode. In this example, the third metal layer can be used for the contact-connection of source and drain region.

Another aspect of the invention provides a semiconductor device having a semiconductor body, the semiconductor body comprising: a first semiconductor structure having a dielectric layer and a first gate electrode that comprises a first conductor, and a second semiconductor structure having a dielectric layer and a second gate electrode that comprises a second conductor which differs from the first conductor and of which the part that adjoins the dielectric layer has a different work function from the corresponding part of the first conductor, and the semiconductor device being produced using the method according to one embodiment of the present invention. In particular, the first and second semiconductor structures may be transistors.

Other characteristics, properties and advantages of various embodiments of the present invention will become clear from the following detailed description in conjunction with the appended figures which, as an example, illustrate the basic principles of the invention.

DESCRIPTION OF CERTAIN EMBODIMENTS

Figure 1:
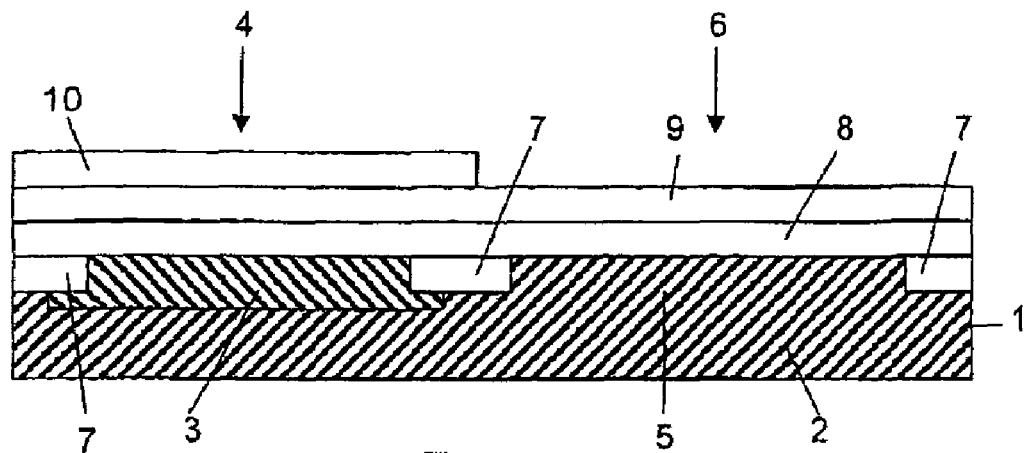
FIGS. 1-6 illustrate a cross section through a semiconductor device in successive stages of the fabrication in accordance with a first embodiment of the invention.

Various embodiments of the present invention will be described below with the aid of various embodiments and with reference to various figures. However, the invention is not restricted to these embodiments and figures. The figures described are only diagrammatic and also do not restrict the invention. The dimensions of some elements may be exaggerated and not to scale in the figures in order to explain a particular concept.

One embodiment of the present invention can be used to fabricate semiconductor structures having two electrodes with different work functions. In one particular case, for example, it is possible to fabricate semiconductor structures which are provided with a control electrode, for example, a gate electrode, and a first and second main electrode, for example, a source and drain region. The following text will discuss the fabrication of a semiconductor device having two semiconductor structures, each with a gate electrode and a source and drain region in accordance with embodiments of the present invention. However, this is done only in the context of discussion of the invention and does not impose any restriction on the invention.

FIGS. 1-6 illustrate a cross section through a semiconductor device in successive stages of the fabrication with the aid of a first preferred embodiment of the invention. During formation of the device 30, the starting point is a semiconductor body 1 having a substrate 2. In the substrate 2, which in the embodiment under discussion is a p-type silicon substrate 2 but may in general be any other suitable substrate, during the subsequent stages a first MOSFET transistor 4 will be formed at the location of an n-type semiconductor region 3 which has been introduced into the p-type substrate 2 (cf. FIG. 1). A part of the n-type semiconductor region 3 will then form the channel region 3A of this first MOSFET transistor 4. Then, channel region 5 of a second MOSFET transistor 6 will be formed in an adjacent part of the substrate 2. The channel regions 3A, 5 of two adjacent transistors 4, 6 are electrically isolated from one another by means of insulating regions 7, which may, for example, be formed from silicon dioxide. These insulating regions 7 are also known as field insulation regions, and in advanced technologies they may be formed by the etching of trenches into the substrate 2, which are then filled with an oxide. Therefore, these insulating regions 7 are also referred to as trench isolation.

The surface of the semiconductor body 1 is covered with a dielectric layer 8 which, by way of example, may contain silicon dioxide but which may also be made from any suitable dielectric material, and which may have a thickness of between, for example, about 0.5 and about 1.5 nm. Then, a metal layer 9 is applied to this dielectric layer 8. This metal layer 9 may, for example, comprise nickel, titanium or cobalt or a combination thereof and may have a thickness of between about 5 and about 50 nm. In the preferred embodiment described, the metal layer 9 contains nickel and has a thickness of about 5 nm. The metal layer 9 can be deposited with the aid of, for example, a physical vapour deposition (PVD) technique, for example, sputtering. Then, a mask 10 is deposited on this metal layer, for example, with the aid of photolithography. This mask 10 may be made, for example, from photoresist.

Figure 2:
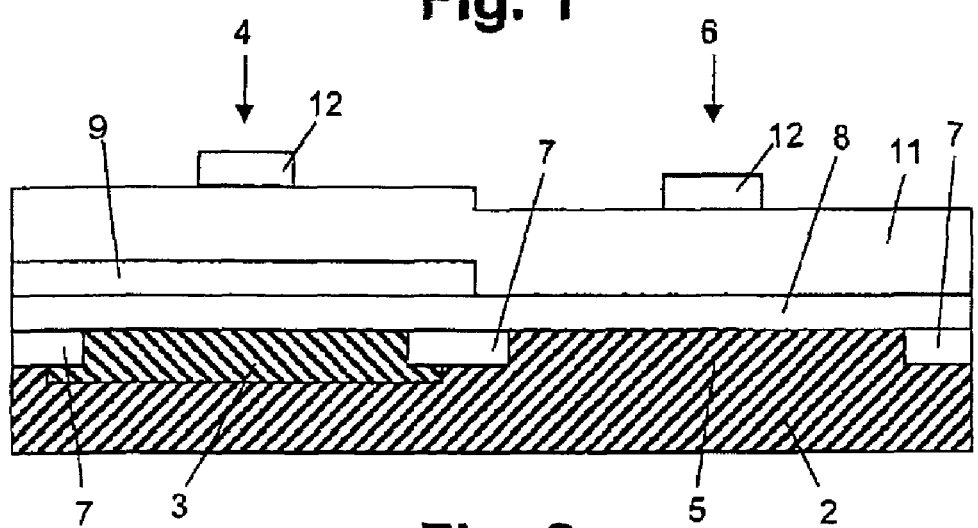
Figure 3:
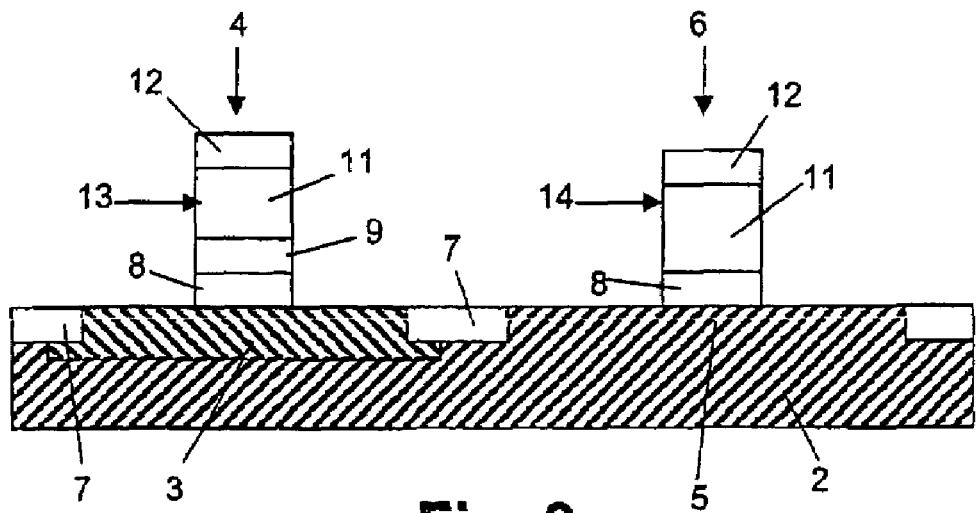

In a subsequent step, the metal layer 9 is removed at the location of the second transistor 6 which is to be formed, with the aid of the deposited mask 10. This step is illustrated in FIG. 2. This can be done, for example, by means of etching with the aid of an etchant comprising sulphuric acid and hydrogen peroxide. Then, the mask 10 is removed, for example, with the aid of what is known as a mask stripper. By way of example, a plasma etching process can be used for this purpose. Then, after cleaning, a silicon layer 11, for example, an n-type doped polycrystalline silicon, is applied with the aid of, for example, chemical vapour deposition (CVD) or physical vapour deposition, for example, sputtering. The thickness of the silicon layer 11 may, for example, be between about 20 and about 100 nm and in this embodiment is about 50 nm. The silicon layer 11 may be relatively thick, with the result that the gate electrodes 13, 14 of the transistors 4, 6 which are to be formed may be of a suitable and approximately equal height. With the aid of photolithography, for example, a mask 12 is patterned on the silicon layer 11 at the location of the gate electrodes 13, 14 which are to be formed for the two transistors 4, 6.

After that, the superfluous parts of the layer structure outside the masks 12 are removed, for example, by etching, in the embodiment described by means of a dry plasma etching process. The semiconductor body 1 in this case functions as an etching stop layer. The remaining parts form the gate electrodes 13, 14 of the transistors 4, 6 which are to be formed (cf. FIG. 3).

Figure 4:
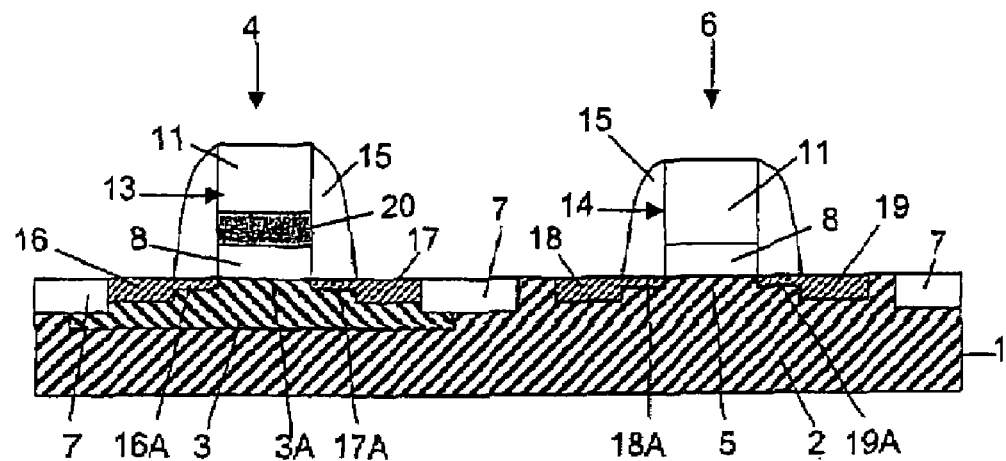
Figure 5:
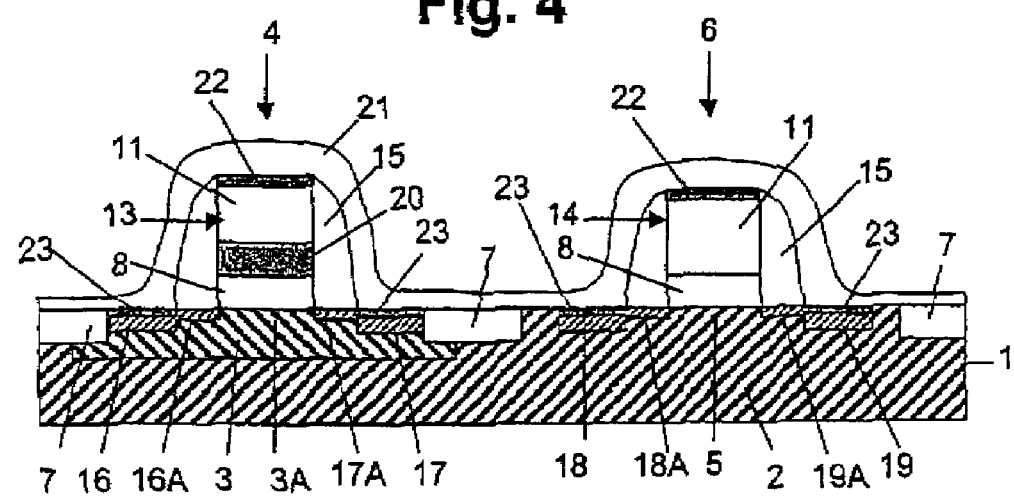
Figure 6:
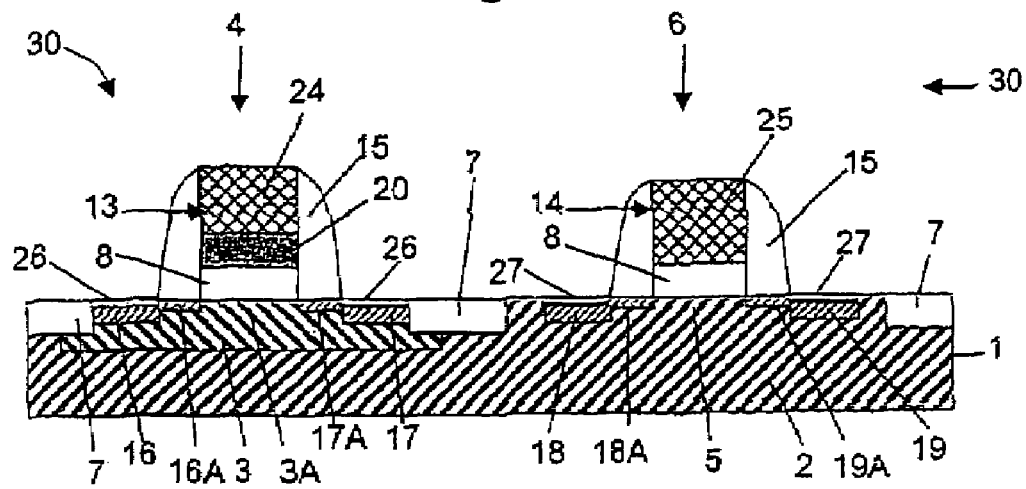

In a subsequent step, the mask 12 is removed, for example, in the manner which has been described above for the removal of mask 10 (cf. FIG. 4). Then, for example, with the aid of CVD, an insulating layer (not shown in the drawing) of, for example, silicon nitride is applied over the structure shown in FIG. 3 without the mask 12. The flat parts of this layer, located on the gate electrodes 13, 14 and between them, are then removed again, for example, by means of an anisotropic plasma etching process. In this way, spacers 15 are formed against the side walls of the gate electrodes 13, 14 by the remaining parts of the silicon nitride layer.

Next, the source and drain regions 16, 17 and 18, 19 of the two transistors 4, 6, respectively, are formed by means of ion implantation. This step can be carried out, for example, by, first of all, forming source and drain regions 16, 17 of the first transistor 4, for example, by means of a boron ion implantation step, with the second transistor 6 covered with a photoresist mask (not shown in the drawing). Then, in a similar way, source and drain region 18, 19 of the second transistor 6 are formed, for example, using an arsenic ion implantation step. In this embodiment of the invention, the transistors 4, 6 are also provided with what is known as LDD (lightly doped drain) regions (16A, 17A and 18A, 19A), which means that before the spacers 15 are formed, a lightly doped part of source and drain regions 16, 17 respectively 18, 19 of the transistors 4, 6, has already been formed. In a suitable heat treatment lasting a few minutes at a first, higher temperature in the temperature range between about 650° C. and about 850° C., the metal layer 9 is converted, through interaction with the silicon layer 11 above it, into a disilicide region 20 at the location of the first transistor 4. The above-mentioned temperature range is suitable not only for the formation of nickel disilicide but also for the formation of a metal disilicide in general (cf. U.S. Pat. No. 6,440,851, FIGS. 4a and b).

Then, a further metal layer 21 is applied (cf. FIG. 5), which in this embodiment of the invention likewise contains nickel. The thickness of the further metal layer 21 is preferably between about 5 and about 50 nm. Then, in this embodiment, a part 22 of the further metal layer 21 is incorporated in the polycrystalline silicon 11 of the gate electrodes 13, 14 by means of a heat treatment, with the result that a metal silicide is formed. Similar parts 23 of the further metal layer 21 are in the process incorporated in the semiconductor body 1, likewise so as to form metal silicide, at the location of source and drain regions 16, 17 respectively 18, 19 of the two transistors 4, 6.

Then, the remaining part of the further metal layer 21 is removed by etching. During a heat treatment lasting a few minutes at a second, lower temperature in a temperature range between, for example, about 450° C. and about 650° C., then in the silicon of the gate electrodes 13, 14 further metal silicide or, for the particular embodiment described here, nickel monosilicide regions 24, 25, are subsequently formed in the first gate electrode 13 and the second gate electrode 14, respectively. The temperature range given above is generally suitable for the formation of a monosilicide of a metal (cf. U.S. Pat. No. 6,440,851, FIGS. 4a and b). Since the two temperature ranges, namely that used for the formation of disilicide and that used for the formation of monosilicide, are to be applicable to all possible silicide-forming metals, the two regions adjoin or may even overlap each other.

It is preferable for the conditions for the formation of the further metal silicide to be selected in such a manner that this further silicide in the second transistor is formed as far as the dielectric layer 8. One embodiment of the invention is in this context based on the insight that a metal disilicide generally has a different work function from a monosilicide. In the preferred embodiment, therefore, a region 24 having a higher work function, namely that of the nickel disilicide, is located on top of/adjacent the dielectric layer 8 in transistor 4, and a nickel monosilicide having a lower work function is located in transistor 6. By way of example, the silicide having the higher work function can be selected for the PMOST and the silicide having the lower work function can be selected for the NMOST. Furthermore, contact regions 26, 27 are also formed in the source and drain regions 16, 17 and 18, 19 of the two transistors 4, 6.

It is preferable for the metal silicide to be formed as a silicon-rich silicide. This is thermodynamically the most stable with respect to silicon. A silicide of this type is often formed at elevated temperatures. Moreover, it generally has the lowest electrical resistance. If nickel is selected for the metal layer, the work function of the disilicide is closest to the value desired for a PMOST 4. The nickel monosilicide, having a lower work function, is more suitable for an NMOST 6 and can be formed at a lower temperature. Since the formation of metal silicide leads to the formation of a disilicide at higher temperatures while a monosilicide at lower temperatures, the two processes can as far as possible be carried out independently of one another, since the first process (formation of metal disilicide) cannot be carried out successfully at the temperature of the second process (formation of metal monosilicide).

It is preferable for the first transistor 4 to be formed as a PMOS transistor. If the metal silicide is formed as a nickel disilicide, in any event a silicide having the highest work function is located in the vicinity of the dielectric layer 4 in the first gate electrode 13, which is desirable for a PMOST.

In one embodiment, the fabrication of the semiconductor device is then continued in the way which is customary in CMOS technology. In particular further insulators and a desired conductor pattern as well as connection regions are applied. Individual devices 30 are obtained by means of a separation technique, such as for example sawing.

One embodiment of the invention is based on the insight that the etching of a layer other than the silicon layer 11, in this case the metal layer 9, makes it possible to provide one of the gate electrodes 13 with a metal silicide 24 that adjoins the dielectric layer 8 and has a first work function, while the other gate electrode 14 in the vicinity of the dielectric layer 8 may contain a material 25 having a different work function. The etching of a material other than the silicon layer 11, in particular of the metal layer 9 which has a lower thickness than the silicon layer 11, avoids asymmetry in the structure of the two transistors 4, 6.

At the location of the second transistor 6, the metal layer 9 can be removed particularly selectively with respect to the material of the dielectric layer 8 before the metal silicide is formed. The result is also a more symmetrical structure compared to the prior art, since the gate electrodes 13, 14 of the two transistors 4, 6 can still comprise silicon without an additional silicon deposition step being required for this purpose. As a result, and also on account of the application of a further metal layer 21 to the silicon layer 7 at the location of the two transistors 4, 6, which further metal layer is then used to form a further metal silicide, the gate electrodes 13, 14 of the two transistors 4, 6 can be provided with very favorable properties, such as a low resistance and the absence of what is known as the depletion layer effect. This also offers the option of providing source and drain regions 16, 17 and 18, 19 of the two transistors 4, 6 with a connection conductor 26, 27 in the form of a silicide in a single process step.

Finally, one advantage of one embodiment of the invention is that the use of the further metal silicide opens up the possibility of forming the two gate electrodes 13, 14 using metal silicides 24, 25 having a different silicon content. This also enables the two gate electrodes 13, 14 in the vicinity of the dielectric layer 8 to be provided with a silicide-containing part having a different composition which is suitable for PMOST and NMOST, respectively.

FIGS. 7-12 illustrate a cross section through a semiconductor device 40 in successive stages of the fabrication in accordance with a second embodiment of the invention. In discussing these figures, in particular the differences compared to the method described above will be explained. Corresponding or identical process steps can be carried out as discussed above in connection with the first embodiment.

Figure 7:
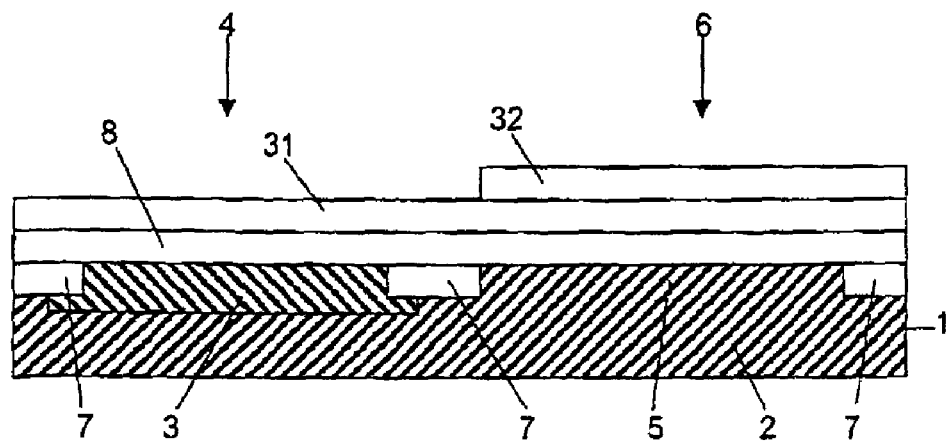
FIGS. 7-12 illustrate a cross section through a semiconductor device in successive stages of the fabrication in accordance with a second embodiment of the invention.
Figure 8:
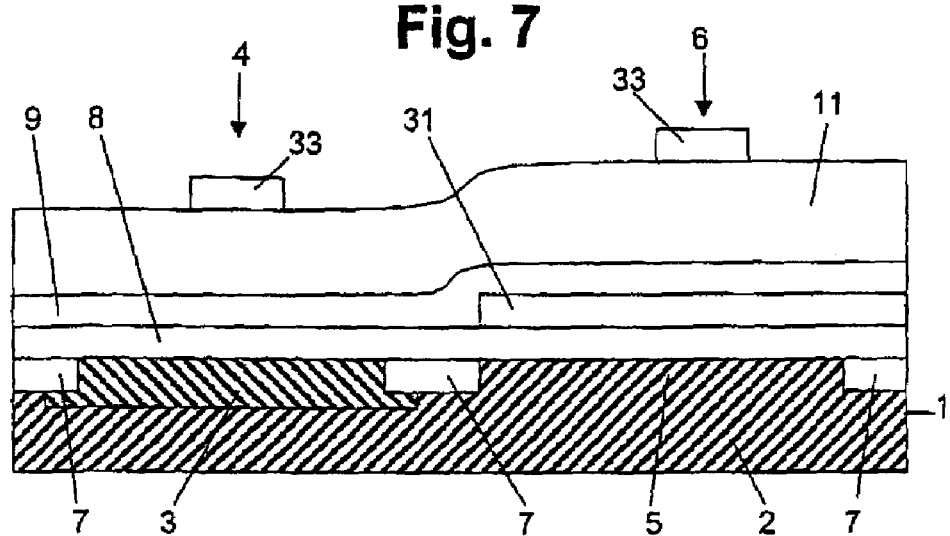

The surface of a semiconductor body 1 is covered with a dielectric layer 8, which in the present embodiment comprises silicon dioxide but which may be made from any suitable dielectric material and may, for example, be between about 0.5 and about 1.5 nm thick. A metal layer 31, which may preferably be from about 5 to about 50 nm thick and in the present embodiment is about 10 nm thick, is applied on top of the dielectric layer 8 (FIG. 7). This metal layer 31 consists of a metal which is stable compared to a metal layer which is subsequently to be applied and with which a metal silicide will be formed and also compared to the metal silicide which is to be formed. The metal layer 31 may, for example, be a layer of molybdenum, tungsten, platinum, iridium, tantalum, hafnium or any other suitable metal and can be deposited on the dielectric layer 8, for example, by means of vapour deposition. With the aid of a mask 32, metal layer 31 is removed at the location of the first transistor 4, for example, by etching.

After the mask 32 has been removed, a metal layer 9 is applied, for example, by vapour deposition, followed by deposition of a polycrystalline silicon layer 11, for example, by means of CVD. These layers 9 and 11 may have similar thicknesses to the layers 9 and 11 in the first embodiment. In the present exemplary embodiment, the metal layer 9 comprises nickel, but may also comprise other metals, for example, cobalt or titanium. Then, a mask 33 is patterned on the structure which has been formed (cf. FIG. 8).

Figure 9:
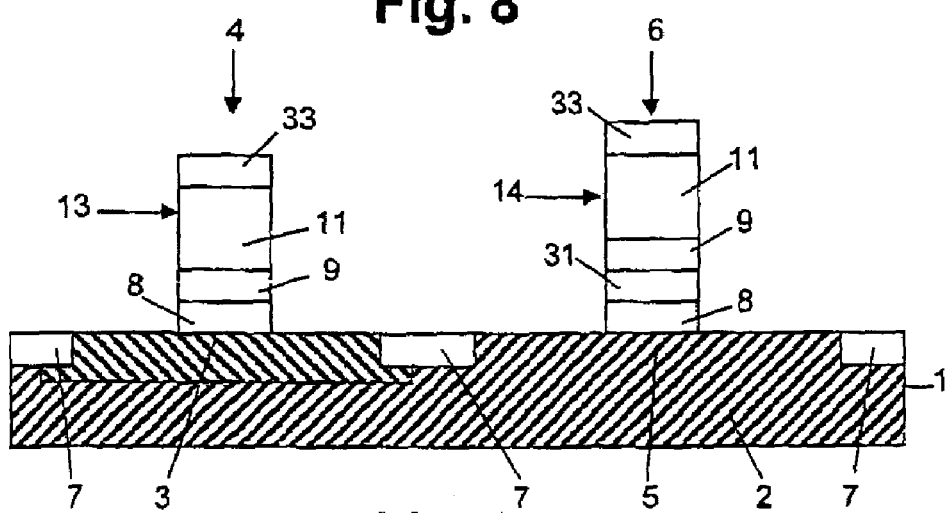

Then, the gate electrodes 13, 14 of the two transistors 4, 6 are formed, for example, by means of plasma etching with the aid of mask 33. This is illustrated in FIG. 9. Next, the mask 33 is removed and source and drain regions 16, 17 respectively 18, 19 of the two transistors 4, 6 are formed, as are spacers 15.

Figure 10:
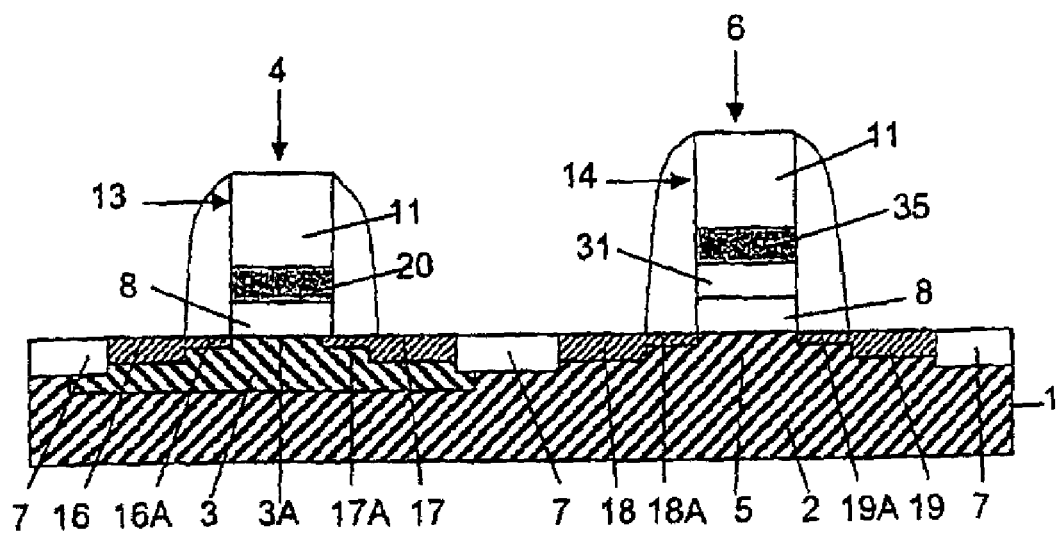

During a suitable heat treatment at a first, high temperature, for example, in a temperature range between about 650° C. and about 850° C., the nickel layer 9 is converted into a nickel disilicide region 20, 35 in the first gate electrode 13 and second gate electrode 14, respectively (FIG. 10).

Figure 11:
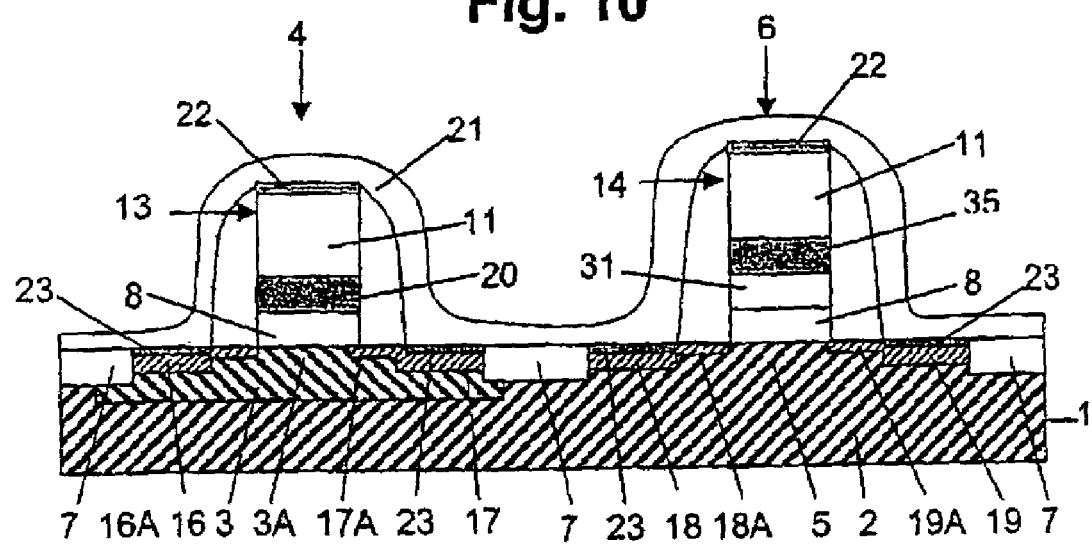
Figure 12:
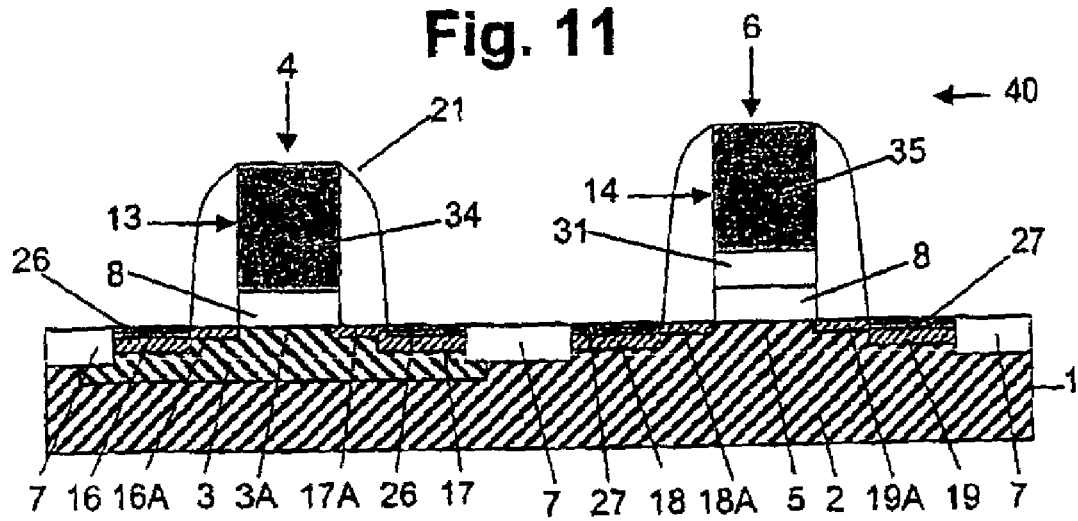
Figure 13:
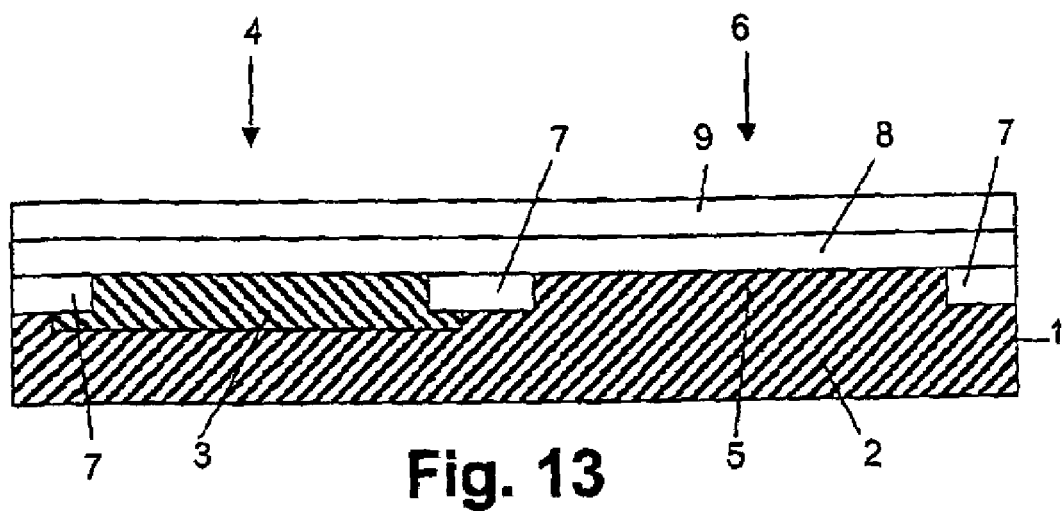
FIGS. 13-20 illustrate a cross section through a semiconductor device in successive stages of the fabrication in accordance with a third embodiment of the invention.
Figure 14:
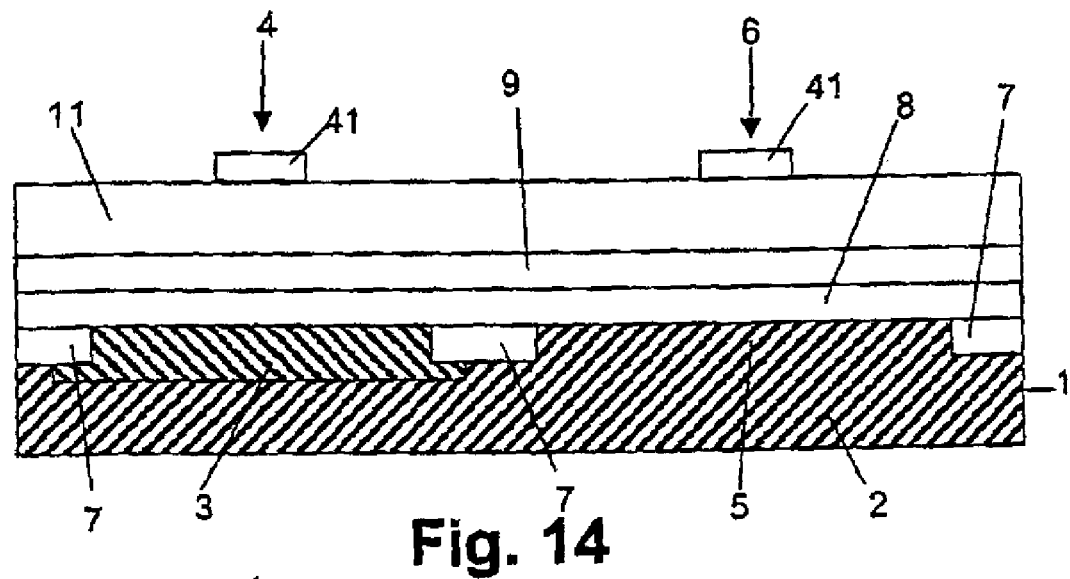
Figure 15:
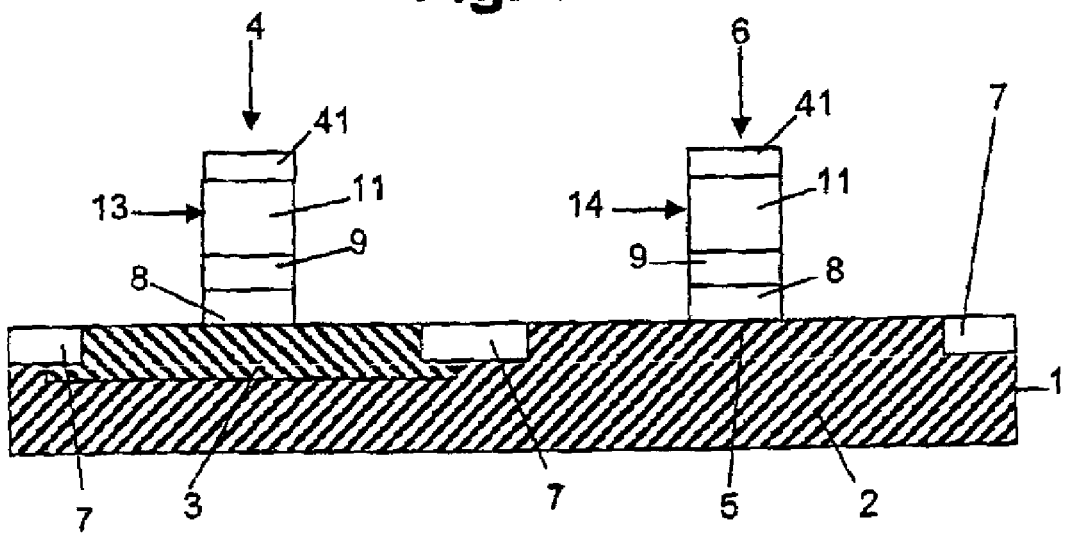
Figure 16:
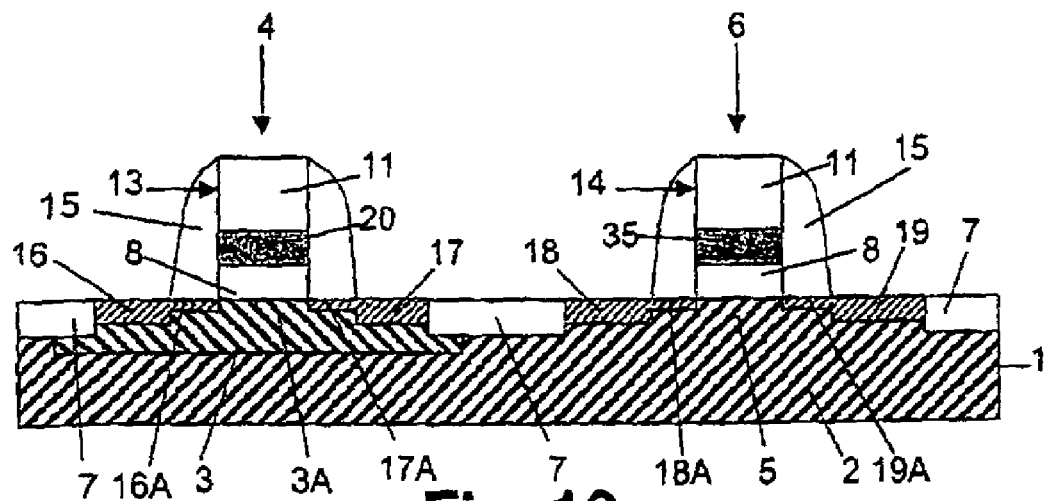
Figure 17:
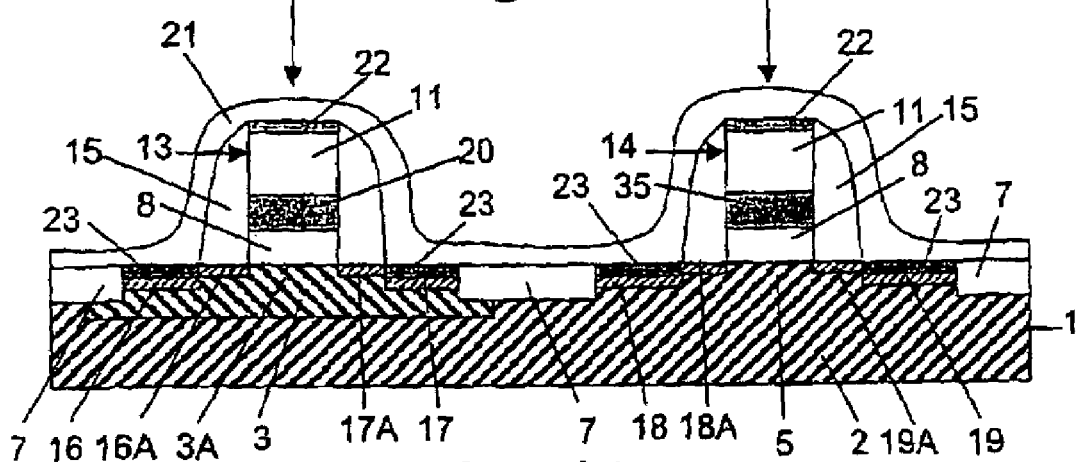
Figure 18:
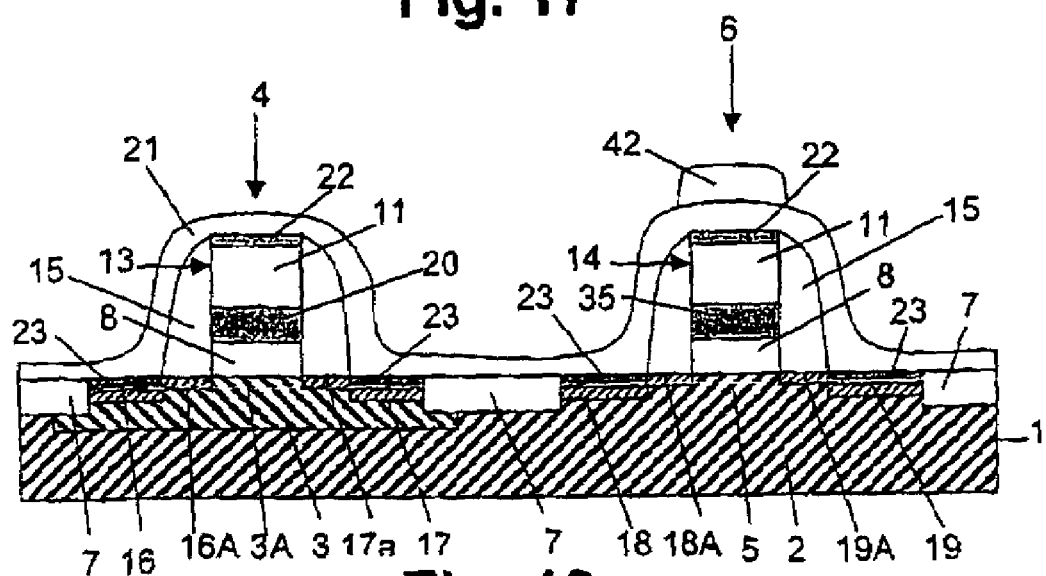
Figure 19:
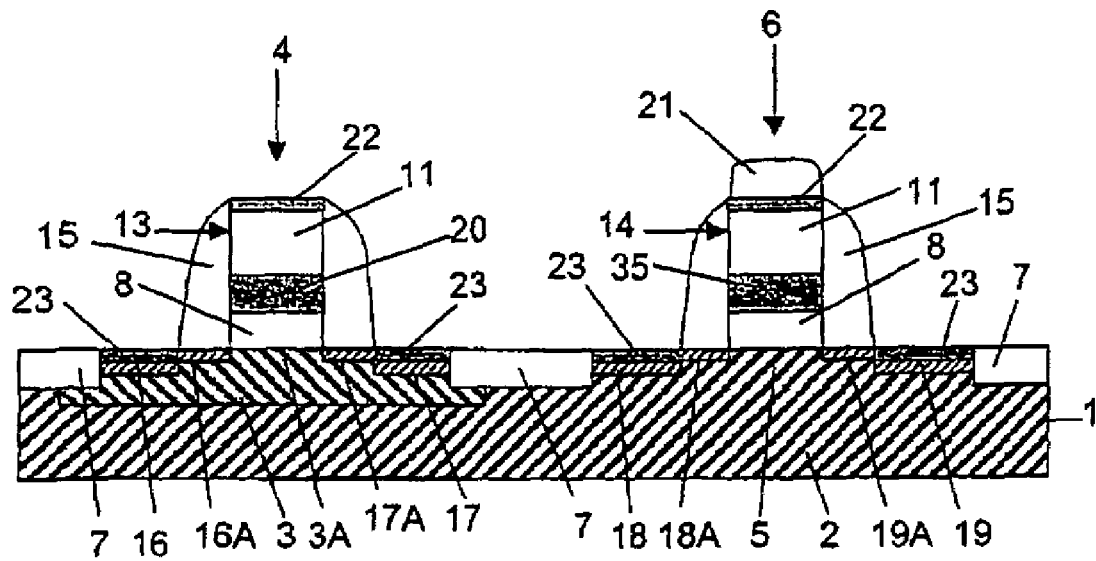

Then, a further metal layer 21 is applied, which in this embodiment is nickel. A heat treatment at a second, lower temperature, for example, in a temperature range between about 450° C. and about 650° C., once again causes parts 22 and 23 of the further metal layer 21 to be incorporated in the semiconductor body 1, respectively at the location of the gate electrodes 13, 14 and the source and drain regions 16, 17 and 18, 19 of the transistors 4, 6 (FIG. 11). After the remaining part of the further metal layer 21 has been removed by means of etching, for example, the remaining silicon parts of the gate electrodes 13, 14 are converted into nickel disilicide 34, 35 by means of a suitable heat treatment at a third, again higher temperature, for example, in a temperature range between about 650° C and about 850° C. (FIG. 12). Therefore, the first gate electrode 13 of the PMOST (first transistor 4), in the vicinity of the dielectric layer 8, includes a part 34 which comprises a disilicide with a relatively high work function, while inert metal, such as molybdenum 31, with a lower work function suitable for the NMOST is still present in the vicinity of the dielectric layer 8 in the other gate electrode 14 of the NMOST (second transistor 6). The treatment can be continued as has already been discussed above.

Therefore, with the aid of this second embodiment of the invention, it is once again possible to form a first transistor 4 and a second transistor 6 whose regions adjoining the dielectric layer 8 have different work functions.

FIGS. 13-20 illustrate a cross section through a semiconductor device in successive stages of the fabrication in accordance with a third embodiment of the invention. In particular the differences from the methods discussed above will be explained in the discussion of these figures. Corresponding or identical process steps can be carried out as discussed in connection with the first or second embodiment. In this third embodiment, the applied metal layer 9, which, by way of example, is a nickel layer (FIG. 13), is not locally removed, but rather is completely covered with a silicon layer 11, after which a gate electrode mask 41 is applied for the purpose of forming the gate electrodes 13, 14 (cf. FIG. 14). After the gate electrodes 13, 14 have been formed (cf. FIG. 15), spacers 15 are formed (cf. FIG. 16) and regions 20, 34 of metal disilicide, for example a disilicide of nickel, are formed by a suitable heat treatment at a first, high temperature, for example in a temperature range between about 650° C.and about 850° C.

Figure 20:
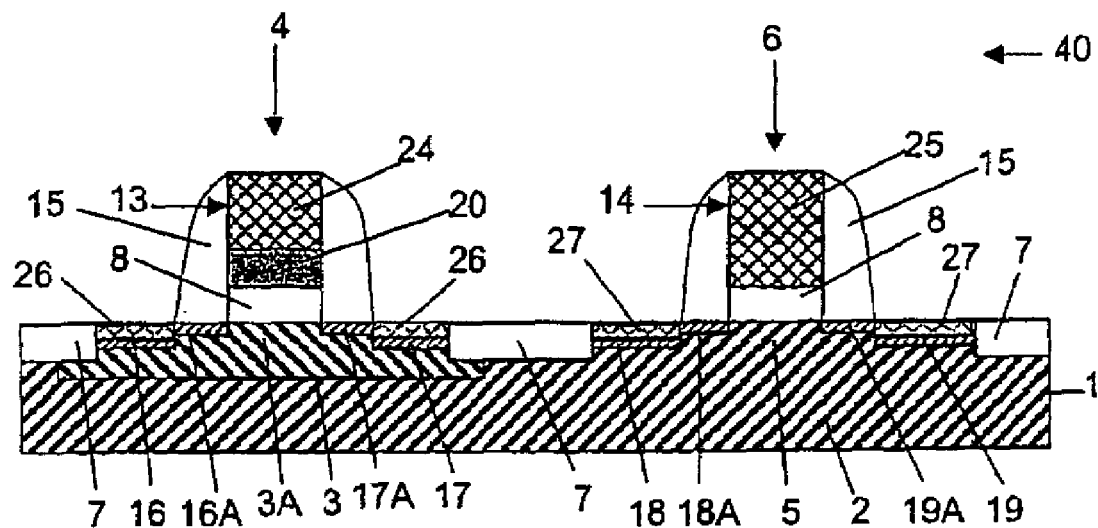

After further metal layer 21, for example, a nickel layer, has been applied (cf. FIG. 17), silicide regions 22 and 23 of monosilicide are formed as described in the previous embodiments by the use of a suitable heat treatment at a second, lower temperature in a temperature range between about 450° C.and about 650° C. Then (cf. FIG. 18), a mask 42 is formed on the second gate electrode 14 at the location of the second transistor 6. Next (cf. FIG. 19) the metal layer 21 is removed in regions where it is not covered by mask 42, with a part of this layer located on top of the second gate electrode 14 remaining in place. Then, the silicon parts of the gate electrodes 13, 14 are converted into nickel monosilicide regions 24, 25 by means of a heat treatment at the second, lower temperature in the temperature range between about 450° C.and about 650° C. The excess of nickel that is present at the location of the second gate electrode 14 also converts the nickel disilicide 35 which is present therein into nickel monosilicide 25 (FIG. 20). In this way it is once again possible to provide the two transistors 4, 6 with a part 20, 25 which is located in the vicinity of the dielectric layer 8 and has a different work function suitable for the corresponding transistor (cf. above).

It should be noted that in all cases the further metal layer 21 is preferably applied after the formed layers have been removed all the way down to the surface of the semiconductor body 1 outside the regions of the first and second gate electrodes 13, 14, and that the further metal layer 21 is also used for the contact-connection of the source and drain regions 16, 17 and 18, 19 of the two transistors 4, 6. This makes it easy to fabricate both NMOS and PMOS transistors with different work functions, with a low resistance in the gate electrodes 13, 14 and in the contact regions 26, 27 of the source and drain regions 16, 17 and 18, 19 and without the undesirable so-called depletion layer effect.

The invention is not restricted to the exemplary embodiments described, since numerous variations and modifications will be possible within the scope of the invention for the person skilled in the art. For example, it is possible to produce devices having a different geometry and/or different dimensions. As an alternative to an Si substrate, it is also possible to use a glass, ceramic or plastic substrate. The semiconductor body can then be formed by what is known as the SOI (Silicon on Insulator). In this context, it is optionally possible to use what is known as a substrate transfer technique.

It should also be noted that materials other than those mentioned in the examples can be used within the scope of the invention. For example, it is also possible to use other metals, such as cobalt, instead of nickel. It should be expressly noted that where the examples opt to use the same metal for the metal layer 9 and the further metal layer 21, it is also possible to use different metals for the two layers. It is also possible to use other deposition techniques for the above-mentioned or other materials, such as epitaxy, sputtering and vapour deposition. It is also possible for "dry" techniques, such as plasma etching, to be used instead of wet-chemical etching methods, and vice versa.

It should also be noted that it is not necessary for the dielectric layer 8 for the two transistors 4, 6 to be made from the same material or to be of the same thickness.

Furthermore, it should be noted that the device may include further active and passive semiconductor elements or electronic components, such as a greater number of diodes and/or transistors and resistors and/or capacitors, optionally in the form of an integrated circuit. Obviously, the fabrication is then adapted appropriately.

Although the invention has been described with reference to specific embodiments, it will be clear to a person skilled in the art that various alternations and adaptations in form and detail are possible without departing from the scope of protection of the present invention.

The invention claimed is:

1. A method of fabricating a semiconductor device, having a semiconductor body comprising i) a first semiconductor structure having a dielectric layer and a first electrode, wherein the first electrode comprises a first conductor, and ii) a second semiconductor structure having a dielectric layer and a second electrode, wherein the second electrode comprises a second conductor which differs from the first conductor, and wherein a part of the second conductor that adjoins the dielectric layer has a different work function from a corresponding part of the first conductor, the method comprising:

forming a dielectric layer on the semiconductor body;
applying a first metal layer onto the dielectric layer, and depositing a silicon layer on the first metal layer, wherein the silicon layer and first metal layer react with each other at a location of at least one semiconductor structure so as to form a first metal silicide at that location, wherein the parts of the conductors having different work functions are formed by etching a layer other than the silicon layer at the location of one of the two semiconductor structures.

2. The method according to claim 1, wherein the first metal layer is formed of a metal selected from the group consisting of nickel, titanium and cobalt.

3. The method according to claim 1, further comprising, after the first and second semiconductor structures have been formed, depositing a third metal layer, the third metal layer being a siliciding metal layer, by means of which a further metal silicide is formed at the location of at least one of the first and second semiconductor structures.

4. The method according to claim 3, wherein the third metal layer is formed of a metal selected from the group consisting of nickel, titanium and cobalt.

5. The method according to claim 3, wherein the etching of the layer other than the silicon layer is performed by etching the third metal layer.

6. The method according to claim 5, wherein at least one of the first semiconductor structure and second semiconductor structure is a field-effect transistor having a gate electrode and a source and drain region and the third metal layer is used for the contact-connection of source and drain region.

7. The method according to claim 1, wherein the etching of the layer other than the silicon layer is carried out by etching the first metal layer.

8. The method according to claim 7, wherein the first metal layer is etched before the silicon layer is applied.

9. The method according to claim 1,wherein the reaction forming the first metal silicide is facilitated at least in part by heating the first metal layer and the silicon layer.

10. The method according to claim 1, wherein the first metal suicide occupies substantially all of the space occupied by the first metal layer prior to the forming of the first metal silicide.

11. The method according to claim 1, wherein the difference in the work functions of the parts of the first and second conductors is at least partly a result of the formation of the first metal silicide.

12. The method according to claim 1, wherein the difference in the work functions of the parts of the first and second conductors is at least partly a result of etching a layer other than the silicon layer.

13. A method of fabricating a semiconductor device, having a semiconductor body comprising i) a first semiconductor structure having a dielectric layer and a first electrode, wherein the first electrode comprises a first conductor, and ii) a second semiconductor structure having a dielectric layer and a second electrode, wherein the second electrode comprises a second conductor which differs from the first conductor, and wherein a part of the second conductor that adjoins the dielectric layer has a different work function from a corresponding part of the first conductor, the method comprising:
- forming a dielectric layer on the semiconductor body;
- applying a first metal layer onto the dielectric layer,
- depositing a silicon layer on the first metal layer, wherein the silicon layer and first metal layer react with each other at a location of at least one semiconductor structure so as to form a first metal silicide at that location, wherein the parts of the conductors having different work functions are formed by etching a layer other than the silicon layer at the location of one of the two semiconductor structures; and
- applying a second metal layer between the first metal layer and the dielectric layer, the second metal layer being a non-siliciding metal layer.

14. The method according to claim 13, wherein the second metal layer is formed of a metal selected from the group consisting of molybdenum, tungsten, platinum, iridium, tantalum and hafnium.

15. The method according to claim 13 wherein the etching of the layer other than the silicon layer is performed by etching the second metal layer.

16. The method according to claim 15, wherein the second metal layer is etched before the silicon layer is applied.

17. A method of fabricating a semiconductor device, having a semiconductor body comprising i) a first semiconductor structure having a dielectric layer and a first electrode, wherein the first electrode comprises a first conductor, and ii) a second semiconductor structure having a dielectric layer and a second electrode, wherein the second electrode comprises a second conductor which differs from the first conductor, and wherein a part of the second conductor that adjoins the dielectric layer has a different work function from a corresponding part of the first conductor, the method comprising:
- forming a dielectric layer on the semiconductor body;
- applying a first metal layer onto the dielectric layer;
- depositing a silicon layer on the first metal layer, wherein the silicon layer and first metal layer react with each other at a location of at least one semiconductor structure so as to form a first metal silicide at that location, wherein the parts of the conductors having different work functions are formed by etching a layer other than the silicon layer at the location of one of the two semiconductor structures; and
- after the first and second semiconductor structures have been formed, depositing a third metal layer, the third metal layer being a siliciding metal layer, by means of which a further metal silicide is formed at the location of at least one of the first and second semiconductor structures,
- wherein the further metal silicide is formed with a silicon content different from the silicon content of the first metal silicide.

18. The method according to claim 17, wherein the first metal silicide is formed as a disilicide and the further metal silicide is formed as a monosilicide.

19. A method of fabricating a semiconductor device, comprising:
- forming a first semiconductor structure having a dielectric layer and a first electrode, wherein the first electrode comprises a first conductor;
- forming a second semiconductor structure having a dielectric layer and a second electrode, wherein the second electrode comprises a second conductor which differs from the first conductor, and wherein a part of the second conductor that adjoins the dielectric layer has a different work function from a corresponding part of the first conductor;
- applying a first metal layer onto at least one of the dielectric layers; and
- depositing a silicon layer on the first metal layer, wherein the silicon layer and first metal layer react with each other at a location of at least one semiconductor structure so as to form a first metal silicide at that location, wherein the parts of the conductors are formed at the location of one of the two semiconductor structures without removing the silicon layer.

20. The method according to claim 19, wherein the first metal layer has a thickness of between about 5 and 50 nm.

21. The method according to claim 19, wherein the first metal layer is formed of a metal selected from the group consisting of nickel, titanium and cobalt.

22. The method according to claim 19, wherein the reaction forming the first metal silicide is facilitated at least in part by heating the first metal layer and the silicon layer.

23. The method according to claim 19, wherein the first metal silicide occupies substantially all of the space occupied by the first metal layer prior to the forming of the first metal silicide.

24. The method according to claim 19, wherein the difference in the work functions of the parts of the first and second conductors is at least partly a result of the formation of the first metal silicide.

25. The method according to claim 19, wherein the difference in the work functions of the parts of the first and second conductors is at least partly a result of etching a layer other than the silicon layer.

26. A method of fabricating a semiconductor device, comprising:
- forming a first field-effect transistor comprising a first source, a drain region, and a channel region of a first conduction type, wherein the first field-effect transistor further comprises a first conductor, and a first gate electrode which is separated from the channel region by a dielectric layer,
- forming a second field-effect transistor comprising a second source, a drain region, and a channel region of a second conduction type, which is the opposite conduction type from the first conduction type, wherein the second field-effect transistor further comprises a second gate electrode, which is separated from the channel region by a dielectric layer, and comprises a second conductor which differs from the first conductor, and wherein a part of the second conductor that adjoins the dielectric layer has a different work function from a corresponding part of the first conductor;
- applying a first metal layer onto at least one of the dielectric layers;
- depositing a silicon layer on the first metal layer, wherein the silicon layer and first metal layer react with each other at a location of at least one semiconductor structure so as to form a first metal silicide at that location, wherein the parts of the conductors are formed at the location of one of the two semiconductor structures without removing the silicon layer.

27. The method according to claim 26, wherein the silicon layer has a thickness of between about 20 and 100 nm.

28. The method according to claim 26, wherein the parts of the conductors are formed by etching.

29. The method according to claim 26, wherein the reaction forming the first metal silicide is facilitated at least in part by heating the first metal layer and the silicon layer.

30. The method according to claim 26, wherein the first metal suicide occupies substantially all of the space occupied by the first metal layer prior to the forming of the first metal silicide.

31. The method according to claim 26, wherein the difference in the work functions of the parts of the first and second conductors is at least partly a result of the formation of the first metal silicide.

32. The method according to claim 26, wherein the difference in the work functions of the parts of the first and second conductors is at least partly a result of etching a layer other than the silicon layer.

* * * * *

UNITED STATES PATENT AND TRADEMARK OFFICE
CERTIFICATE OF CORRECTION

PATENT NO. : 7,226,827 B2  Page 1 of 1
APPLICATION NO. : 10/978786
DATED : June 5, 2007
INVENTOR(S) : Schram et al.

It is certified that error appears in the above-identified patent and that said Letters Patent is hereby corrected as shown below:

Column 1, Line 7, Delete "35U.S.C." and insert -- 35 U.S.C. --, therefor.
Column 1, Line 8, Delete "No. 20030548filed" and insert -- No. 20030548 filed --, therefor.
Column 1, Line 16, Delete "silicide" and insert -- silicided --, therefor.
Column 5, Line 40, Delete "nitrite" and insert -- nitride --, therefor.
Column 5, Line 46, Delete "nitrite" and insert -- nitride --, therefor.
Column 5, Line 65, Delete "C.and" and insert -- C. and --, therefor.
Column 8, Line 21 (Approx.), Delete "C.and" and insert -- C. and --, therefor.
Column 8, Line 28 (Approx.), Delete "C.and" and insert -- C. and --, therefor.
Column 8, Line 38 (Approx.), Delete "C and" and insert -- C. and --, therefor.
Column 9, Line 2, Delete "C.and" and insert -- C. and --, therefor.
Column 9, Line 4, Delete "silicide" and insert -- silicided --, therefor.
Column 9, Line 8, Delete "C.and" and insert -- C. and --, therefor.
Column 9, Line 17, Delete "C.and" and insert -- C. and --, therefor.
Column 10, Line 61, In Claim 10, Delete "suicide" and insert -- silicide --, therefor.
Column 11, Line 17, In Claim 13, Delete "dielectric layer," and insert -- dielectric layer; --, therefor.
Column 12, Line 52, In Claim 26, Delete "layer," and insert -- layer; --, therefor.
Column 14, Line 2, In Claim 30, Delete "suicide" and insert -- silicide --, therefor.

Signed and Sealed this

Twenty-seventh Day of May, 2008

JON W. DUDAS
*Director of the United States Patent and Trademark Office*